(12) United States Patent
Ono et al.

(10) Patent No.: US 8,653,160 B2
(45) Date of Patent: Feb. 18, 2014

(54) INCLUSION COMPLEX CONTAINING EPOXY RESIN COMPOSITION FOR SEMICONDUCTOR ENCAPSULATION

(75) Inventors: Kazuo Ono, Ichihara (JP); Masami Kaneko, Ichihara (JP); Natsuki Amanokura, Ichihara (JP)

(73) Assignee: Nippon Soda Co., Ltd., Tokyo (JP)

( * ) Notice: Subject to any disclaimer, the term of this patent is extended or adjusted under 35 U.S.C. 154(b) by 104 days.

(21) Appl. No.: 12/733,462

(22) PCT Filed: Sep. 19, 2008

(86) PCT No.: PCT/JP2008/002603
§ 371 (c)(1),
(2), (4) Date: Mar. 3, 2010

(87) PCT Pub. No.: WO2009/037862
PCT Pub. Date: Mar. 26, 2009

(65) Prior Publication Data
US 2010/0179250 A1    Jul. 15, 2010

(30) Foreign Application Priority Data

Sep. 21, 2007  (JP) ................... 2007-245404
Jul. 11, 2008  (JP) ................... 2008-181659

(51) Int. Cl.
C08G 59/68   (2006.01)
C08L 63/00   (2006.01)
C07D 233/54  (2006.01)
C07D 233/56  (2006.01)
C07D 233/58  (2006.01)
H01L 23/29   (2006.01)

(52) U.S. Cl.
USPC ...... 523/455; 523/461; 548/335.1; 548/343.5

(58) Field of Classification Search
USPC ............ 523/400, 455, 461; 548/335.1, 335.5, 548/336.1, 341.1, 341.5, 342.5, 343.1, 548/343.5, 346.1
See application file for complete search history.

(56) References Cited

U.S. PATENT DOCUMENTS

| | | |
|---|---|---|
| 3,746,686 A | 7/1973 | Marshall et al. |
| 3,847,612 A | 11/1974 | Winslow |
| 4,244,989 A | 1/1981 | Noomen |
| 4,420,605 A | 12/1983 | Kaufman |
| 5,153,239 A | 10/1992 | Kitagawa et al. |
| 6,727,325 B1 * | 4/2004 | Suzuki et al. ............. 525/523 |
| 2003/0008991 A1 | 1/2003 | Holmes et al. |
| 2003/0054146 A1 | 3/2003 | Kim et al. |
| 2010/0016475 A1 * | 1/2010 | Doering et al. ............. 523/461 |
| 2010/0022744 A1 | 1/2010 | Kaneko et al. |
| 2012/0004349 A1 * | 1/2012 | Kaneko et al. ............. 523/454 |
| 2012/0004377 A1 | 1/2012 | Kaneko et al. |
| 2012/0196991 A1 | 8/2012 | Ono et al. |
| 2013/0059942 A1 | 3/2013 | Ono et al. |
| 2013/0158231 A1 | 6/2013 | Kamegaya et al. |

FOREIGN PATENT DOCUMENTS

| | | |
|---|---|---|
| EP | 0 621 256 A1 | 10/1994 |
| EP | 0 949 286 A1 | 10/1999 |
| JP | A-49-032999 | 3/1974 |
| JP | A-56-100748 | 8/1981 |
| JP | A-57-135870 | 8/1982 |
| JP | A-58-076420 | 5/1983 |
| JP | A-60-252620 | 12/1985 |
| JP | A-01-096278 | 4/1989 |
| JP | B2-04-002638 | 1/1992 |
| JP | A-4-266922 | 9/1992 |
| JP | A-05-194711 | 8/1993 |
| JP | A-06-100662 | 4/1994 |
| JP | A-08-151372 | 6/1996 |
| JP | A-09-143250 | 6/1997 |
| JP | A-10-511718 | 11/1998 |
| JP | A-10-316639 | 12/1998 |
| JP | A-10-324826 | 12/1998 |
| JP | A-11-071449 | 3/1999 |
| JP | A-11-158253 | 6/1999 |
| JP | A-2000-248053 | 9/2000 |

(Continued)

OTHER PUBLICATIONS

International Search Report issued in corresponding International Application No. PCT/JP2008/002603, mailed Dec. 16, 2008. (with English-language translation).

(Continued)

Primary Examiner — Michael J Feely
(74) Attorney, Agent, or Firm — Oliff PLC

(57) ABSTRACT

The invention is an epoxy resin composition for sealing a semiconductor, including (A) an epoxy resin and (B) a clathrate complex. The clathrate complex is one of (b1) an aromatic carboxylic acid compound, and (b2) at least one imidazole compound represented by formula (II):

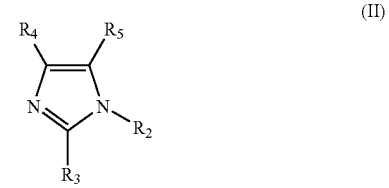

(II)

wherein R2 represents a hydrogen atom, $C_1$-$C_{10}$ alkyl group, phenyl group, benzyl group or cyanoethyl group, and $R_3$ to $R_5$ represent a hydrogen atom, nitro group, halogen atom, $C_1$-$C_{20}$ alkyl group, phenyl group, benzyl group, hydroxymethyl group or $C_1$-$C_{20}$ acyl group. The composition has improved storage stability, retains flowability when sealing, and achieves an effective curing rate applicable for sealing delicate semiconductors.

3 Claims, No Drawings

(56) References Cited

FOREIGN PATENT DOCUMENTS

| JP | A 2001-172225 | 6/2001 | |
|----|----|----|----|
| JP | A-2002-20714 | 1/2002 | |
| JP | A-2002-047337 | 2/2002 | |
| JP | A-2004-503632 | 2/2004 | |
| JP | A-2004-210677 | 7/2004 | |
| JP | A-2004-300041 | 10/2004 | |
| JP | A 2004-300256 | 10/2004 | |
| JP | A 2004-307545 | 11/2004 | |
| JP | A-2006-016542 | 1/2006 | |
| JP | A 2006-206731 | 8/2006 | |
| JP | A 2007-039449 | 2/2007 | |
| TW | 200909467 A | 3/2009 | |
| WO | WO 96/20253 A1 | 7/1996 | |
| WO | WO 2006128542 A1 * | 12/2006 | ........... C07D 233/54 |
| WO | WO 2008075427 A1 * | 6/2008 | ........... C07D 233/54 |
| WO | WO 2008/143314 A1 | 11/2008 | |
| WO | WO 2009/037862 A1 | 3/2009 | |

OTHER PUBLICATIONS

Luo et al., "A Novel Bilayer Cobalt(II)-Organic Framework with Nanoscale Channels Accommodating Large Organic Molecules," Inorganic Chemistry, vol. 42, pp. 4486-4488, 2003.

Aug. 4, 2011 Office Action issued in U.S. Appl. No. 12/448,248.

Chen et al., "Synthesis, structures of cobalt/copper complexes and magnetic property of copper complex with the mixed ligands 5-nitro-1,3-benzenedicarboxylic acid and imidazole," *Inorganic Chemistry Communications*, 2006, vol. 9, pp. 300-303.

Lin et al., "Aromatic Polyoxyalkylene Amidoamines as Curatives for Epoxy Resins-Derivatives from t-Butyl Isophthalic Acid," *Journal of Polymer Research*, 1996, vol. 3, No. 2, pp. 97-104.

Supplementary European Search Report in European Patent Application No. 06842980.2; dated Apr. 19, 2011.

Korean Office Action in Korean Patent Application No. 2009-7012444; dated Mar. 14, 2011 with English-language translation.

Hungarian Patent Office Search Report issued in corresponding Singapore Application No. 2010016608, issued Oct. 6, 2010.

Apr. 7, 2010 International Preliminary Report on Patentability issued in PCT/JP2008/002603.

Jun. 15, 2010 International Search Report issued in International Application No. PCT/JP2010/001663 with English-language translation.

Feb. 27, 2007 International Search Report issued in International Application No. PCT/JP2006/325472 with English-language translation.

Jul. 18, 2012 Supplementary European Search Report issued in European Application No. 08832343.1.

May 20, 2013 Restriction Requirement issued in U.S. Appl. No. 13/138,568.

Aug. 29, 2013 Notice of Allowance issued in U.S. Appl. No. 13/138,568.

Sep. 24, 2013 Office Action issued in U.S. Appl. No. 13/331,772.

* cited by examiner

INCLUSION COMPLEX CONTAINING EPOXY RESIN COMPOSITION FOR SEMICONDUCTOR ENCAPSULATION

The present invention relates to an epoxy resin composition for sealing a semiconductor, wherein a clathrate complex is used as a curing agent and/or curing accelerator.

BACKGROUND ART

Epoxy resin compositions comprising epoxy resin, curing agent, curing accelerator and other additives are used as a sealant of semiconductor devices or electrical parts such as transistor, IC, LSI, etc. Conventionally, amine compounds or imidazole compounds, etc. were used as curing agent or curing accelerator, while there were problems for the storage stability of epoxy resin compositions. Recently, in order to improve the storage stability, it has been proposed to use a clathrate complex comprising imidazole compounds or amine compounds as guest compounds and 1,1',2,2'-tetrakis(4-hydroxyphenyl)ethane as host, as curing accelerator (see patent document 1). However, when 1,1',2,2'-tetrakis(4-hydroxyphenyl)ethane includes imidazole compounds or amine compounds, the storage stability of sealant at normal temperature can be improved compared with when these compounds are used alone or in combination, while it was not sufficient to satisfy the sealant composition with respect to fine specs of semiconductors which has progressed significantly in recent years.

Patent document 1: Japanese Laid-Open Patent Application No. 2004-307545

DISCLOSURE OF THE INVENTION

Object to be Solved by the Invention

The object of the present invention is to improve the storage stability of a sealant, to retain the flowability of the sealant when sealing, and to achieve an efficient curing rate of the sealant by heating to be applicable as a sealant for delicate semiconductors.

Means to Solve the Object

The present inventors made a keen study to solve the above objects, and found out that the above objects can be solved by using a clathrate complex comprising at least an aromatic carboxylic acid compound and an imidazole compound, as a curing agent and/or curing accelerator of epoxy resin. The present invention has been thus completed.

Specifically, the present invention relates to:
[1] an epoxy resin composition for sealing a semiconductor comprising the following component (A) and component (B)
(A) an epoxy resin
(B) a clathrate complex comprising
(b1) an aromatic carboxylic acid compound, and
(b2) at least one imidazole compound represented by formula (II)

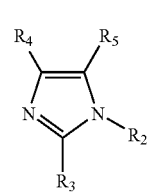

(II)

(wherein $R_2$ represents a hydrogen atom, C1-C10 alkyl group, phenyl group, benzyl group or cyanoethyl group; $R_3$ to $R_5$ represent a hydrogen atom, nitro group, halogen atom, C1-C20 alkyl group, phenyl group, benzyl group, hydroxymethyl group or C1-C20 acyl group).

Further, the present invention relates to:
[2] a solid epoxy resin composition for sealing a semiconductor comprising the following components (A) to (C):
(A) an epoxy resin
(B) a clathrate complex comprising
(b1) an aromatic carboxylic acid compound; and
(b2) at least one imidazole compound represented by formula (II)

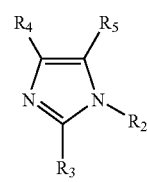

(II)

(wherein $R_2$ represents a hydrogen atom, C1-C10 alkyl group, phenyl group, benzyl group or cyanoethyl group, and $R_3$ to $R_5$ represent a hydrogen atom, nitro group, halogen atom, C1-C20 alkyl group, phenyl group, benzyl group, hydroxymethyl group or C1-C20 acyl group) (C) an inorganic filler.

Further, the present invention relates to:
[3] the epoxy resin composition according to [1] or [2], wherein the aromatic carboxylic acid compound of (b1) is a compound represented by formula (I-1)

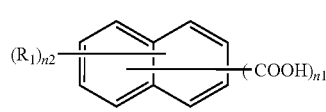

(I-1)

(wherein n1 represents any integer of 1 to 4, n2 represents any integer of 0 to 4; $R_1$ represents a C1-6 alkyl group; nitro group, or hydroxy group); or by formula (I-2)

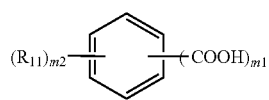

(I-2)

(wherein m1 represents any integer of 1 to 4; m2 represents any integer of 0 to 2; $R_{11}$ represents C1-6 alkyl group, nitro group, hydroxy group, or a compound represented by the following formula

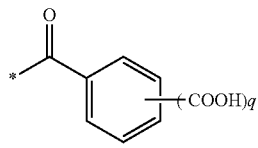

(wherein q represents an integer of 1 or 2; * shows a binding position).

[4] the epoxy resin composition according to [1] or [2], wherein the aromatic carboxylic acid compound of (b1) is at least one selected from the group consisting of 3,5-dihydroxybenzoic acid, isophthalic acid, terephthalic acid, 5-t-butyl isophthalic acid, 5-nitroisophthalic acid, 5-hydroxyisophthalic acid, trimellitic acid, trimesic acid, pyromellitic acid, 2,6-naphthalene dicarboxylic acid, 1,4-naphthalene dicarboxylic acid and benzophenone-4,4'-dicarboxylic acid;

[5] the epoxy resin composition according to any one of [1] to [4], wherein the clathrate complex of (B) is a clathrate complex of
(b1) at least one aromatic carboxylic acid compound selected from the group consisting of 3,5-dihydroxybenzoic acid, isophthalic acid, terephthalic acid, 5-t-butyl isophthalic acid, 5-nitroisophthalic acid, 5-hydroxyisophthalic acid, trimellitic acid, trimesic acid, pyromellitic acid, 2,6-naphthalene dicarboxylic acid, 1,4-naphthalene dicarboxylic acid and benzophenone-4,4'-dicarboxylic acid; and (b2) at least one imidazole compound selected from the group consisting of 2-methylimidazole, 2-ethyl-4-methylimidazole, 2-undecylimidazole and 2-phenyl-4-methyl-5-hydroxymethylimidazole.

Further, the present invention relates to:

[6] a clathrate complex comprising at least one selected from the group consisting of trimesic acid, 2,6-naphthalene dicarboxylic acid, 1,4-naphthalene dicarboxylic acid and benzophenone-4,4'-dicarboxylic acid; and
at least one imidazole compound represented by formula

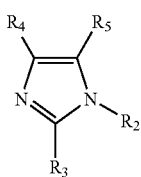

(wherein $R_2$ represents a hydrogen atom, C1-C10 alkyl group, phenyl group, benzyl group or cyanoethyl group; $R_3$ to $R_5$ represent a hydrogen atom, nitro group, halogen atom, C1-C20 alkyl group, phenyl group, benzyl group, hydroxymethyl group or C1-C20 acyl group).

BEST MODE OF CARRYING OUT THE INVENTION

The epoxy resin composition for sealing a semiconductor of the present invention is not particularly limited as long as it comprises
(A) an epoxy resin; and
(B) a clathrate complex comprising
(b1) an aromatic carboxylic acid compound, and
(b2) at least one imidazole compound represented by formula (II)

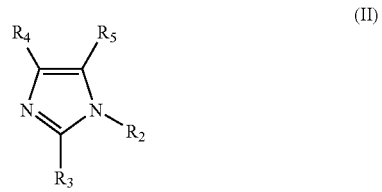

(wherein, $R_2$ represents a hydrogen atom, C1-C10 alkyl group, phenyl group, benzyl group or cyanoethyl group; $R_3$ to $R_5$ represent a hydrogen atom, nitro group, halogen atom, C1-C20 alkyl group, phenyl group, benzyl group, hydroxymethyl group or C1-C20 acyl group).

As an epoxy resin of component (A), various conventionally-known polyepoxy compounds can be used, and examples include: aromatic glycidylether compounds such as bis(4-hydroxyphenyl)propane diglycidylether, bis(4-hydroxy-3,5-dibromophenyl)propane diglycidylether, bis(4-hydroxyphenyl)ethane diglycidylether, bis(4-hydroxyphenyl)methane diglycidylether, resorcinol diglycidylether, phloroglucinol triglycidylether, trihydroxy biphenyl triglycidylether, tetraglycidyl benzophenone, bisresorcinol tetraglycidylether, tetramethyl bisphenol A diglycidylether, bisphenol C diglycidylether, bisphenol hexafluoropropane diglycidylether, 1,3-bis[1-(2,3-epoxypropoxy)-1-trifluoromethyl-2,2,2-trifluoroethyl]benzene, 1,4-bis[1-(2,3-epoxypropoxy)-1-trifluoromethyl-2,2,2-trifluoromethyl]benzene, 4,4'-bis(2,3-epoxypropoxy)octafluoro biphenyl, phenol novolac-type bisepoxy compound, etc.; alicyclic polyepoxy compounds such as alicyclic diepoxyacetal, alicyclic diepoxyadipate, alicyclic diepoxycarboxylate, vinylcyclohexene dioxide, etc.; glycidyl ester compounds such as diglycidyl phthalate, diglycidyl tetrahydrophtalate, diglycidyl hexahydrophtalate, dimethyl glycidylphtalate, dimethyl glycidyl hexahydrophtalate, diglycidyl-p-oxybenzoate, diglycidyl cyclopentane-1,3-dicarboxylate, dimer acid glycidylester, etc.; glycidyl amine compounds such as diglycidylaniline, diglycidyltoluidine, triglycidylaminophenol, tetraglycidyl diaminodiphenylmethane, diglycidyl tribromoaniline, etc.; and heterocyclic epoxy compounds such as diglycidylhydantoin, glycidyl glycid oxyalkylhydantoin, triglycidyl isocyanurate, etc.

Component (B) is not particularly limited as long as it is a clathrate complex comprising at least an aromatic carboxylic acid compound, and an imidazole compound represented by formula (II)

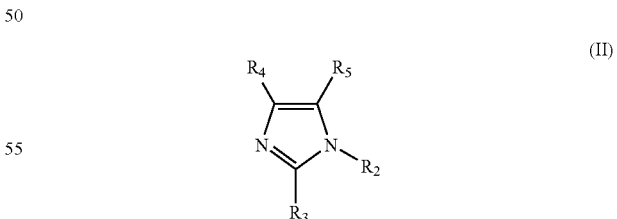

(wherein $R_2$ represents a hydrogen atom, C1-C10 alkyl group, phenyl group, benzyl group or cyanoethyl group, $R_3$ to $R_5$ represent a hydrogen atom, nitro group, halogen atom, C1-C20 alkyl group, phenyl group, benzyl group, hydroxymethyl group or C1-C20 acyl group), and it may comprise a third component such as a solvent, etc.

Herein, a "clathrate complex" relates to a compound wherein 2 or more molecules are bound via a bond other than a covalent bond. More preferably, it is a crystalline compound wherein 2 or more molecules are bound via a bond other than a covalent bond. The compound to include is called a host compound, and the compound to be included is called a guest compound. Further, salts are encompassed in the herein-mentioned clathrate complex.

The ratio of the above-mentioned aromatic carboxylic acid compound and the imidazole compound is not particularly limited as long as it can form a clathrate complex. However, it is preferred that the imidazole compound is 0.1 to 5.0 mol with respect to 1 mol of the aromatic carboxylic acid compound, and more preferably 0.5 to 4.0 mol.

When a third component is contained, it is preferred that the third component is 40 mol % or less with respect to the total amount of the composition, more preferably 10 mol % or less. Particularly, it is most preferred that the third component is not contained.

The aromatic carboxylic acid compound is not particularly limited, and the following can be exemplified:

benzoic acid, 2-methylbenzoic acid, 3-methylbenzoic acid, 4-methylbenzoic acid, 2-ethylbenzoic acid, 3-ethylbenzoic acid, 4-ethylbenzoic acid, 2-n-propylbenzoic acid, 3-n-propylbenzoic acid, 4-n-propylbenzoic acid, 2-butylbenzoic acid, 3-butylbenzoic acid, 4-butylbenzoic acid, 2-isopropyl benzoic acid, 3-isopropyl benzoic acid, 4-isopropyl benzoic acid, 2-isobutyl benzoic acid, 3-isobutyl benzoic acid, 4-isobutyl benzoic acid, 2-hydroxybenzoic acid, 3-hydroxybenzoic acid, 4-hydroxybenzoic acid, 2-nitrobenzoic acid, 3-nitrobenzoic acid, 4-nitrobenzoic acid, methyl-2-nitrobenzoate, methyl-3-nitrobenzoate, methyl-4-nitrobenzoate, ethyl-2-nitrobenzoate, ethyl-3-nitrobenzoate, ethyl-4-nitrobenzoate, propyl-2-nitrobenzoate, propyl-3-nitrobenzoate, propyl-4-nitrobenzoate, butyl-2-nitrobenzoate, butyl-3-nitrobenzoate, butyl-4-nitrobenzoate, 2,3-dimethylbenzoic acid, 2,4-dimethylbenzoic acid, 2,5-dimethylbenzoic acid, 2,6-dimethylbenzoic acid, 3,4-dimethylbenzoic acid, 3,5-dimethylbenzoic acid, 3,6-dimethylbenzoic acid, 4,5-dimethylbenzoic acid, 4,6-dimethylbenzoic acid, 2,3-diethylbenzoic acid, 2,4-diethylbenzoic acid, 2,5-diethylbenzoic acid, 2,6-diethylbenzoic acid, 3,4-diethylbenzoic acid, 3,5-diethylbenzoic acid, 3,6-diethylbenzoic acid, 4,5-diethylbenzoic acid, 4,6-diethylbenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 3,6-dihydroxybenzoic acid, 4,5-dihydroxybenzoic acid, 4,6-dihydroxybenzoic acid;

phthalic acid, 3-methylphthalic acid, 4-methylphthalic acid, 5-methylphthalic acid, 6-methylphthalic acid, 3-ethylphthalic acid, 4-ethylphthalic acid, 5-ethylphthalic acid, 6-ethylphthalic acid, 3-n-propylphthalic acid, 4-n-propylphthalic acid, 5-n-propylphthalic acid, 6-n-propylphthalic acid, 3-butylphthalic acid, 4-butylphthalic acid, 5-butylphthalic acid, 6-butylphthalic acid, 3-isopropylphthalic acid, 4-isopropylphthalic acid, 5-isopropylphthalic acid, 6-isopropylphthalic acid, 3-isobutylphthalic acid, 4-isobutylphthalic acid, 5-isobutylphthalic acid, 6-isobutylphthalic acid, 3-hydroxyphthalic acid, 4-hydroxyphthalic acid, 5-hydroxyphthalic acid, 6-hydroxyphthalic acid, 3,4-dihydroxyphthalic acid, 3,5-dihydroxyphthalic acid, 3,6-dihydroxyphthalic acid, 4,5-dihydroxyphthalic acid, 4,6-dihydroxyphthalic acid, 3-nitrophthalic acid, 4-nitrophthalic acid, 5-nitrophthalic acid, 6-nitrophthalic acid, 3,4-dimethylphthalic acid, 3,5-dimethylphthalic acid, 3,6-dimethylphthalic acid, 4,5-dimethylphthalic acid, 4,6-dimethylphthalic acid;

isophthalic acid, 2-methylisophthalic acid, 4-methylisophthalic acid, 5-methylisophthalic acid, 6-methylisophthalic acid, 2-ethylisophthalic acid, 4-ethylisophthalic acid, 5-ethylisophthalic acid, 6-ethylisophthalic acid, 2-n-propylisophthalic acid, 4-n-propylisophthalic acid, 5-n-propylisophthalic acid, 6-n-propylisophthalic acid, 2-isopropylisophthalic acid, 4-isopropylisophthalic acid, 5-isopropylisophthalic acid, 6-isopropylisophthalic acid, 2-butyl isophthalic acid, 4-butyl isophthalic acid, 5-butyl isophthalic acid, 6-butyl isophthalic acid, 2-isobutyl isophthalic acid, 4'-isobutyl isophthalic acid, 5-isobutyl isophthalic acid, 6-isobutyl isophthalic acid, 4-t-butyl isophthalic acid, 5-t-butyl isophthalic acid, 6-t-butyl isophthalic acid, 2-hydroxyisophthalic acid, 4-hydroxyisophthalic acid, 5-hydroxyisophthalic acid, 6-hydroxyisophthalic acid, 2,4-dihydroxyisophthalic acid, 2,5-dihydroxyisophthalic acid, 2,6-dihydroxyisophthalic acid, 4,5-dihydroxyisophthalic acid, 4,6-dihydroxyisophthalic acid, 5,6-dihydroxyisophthalic acid, 2,4-dimethylisophthalic acid, 2,5-dimethylisophthalic acid, 2,6-dimethylisophthalic acid, 4,5-dimethylisophthalic acid, 4,6-dimethylisophthalic acid, 5,6-dimethylisophthalic acid, 2-nitroisophthalic acid, 4-nitroisophthalic acid, 5-nitroisophthalic acid, 6-nitroisophthalic acid, 2-methylterephthalic acid, 2-ethylterephthalic acid, 2-n-propylterephthalic acid, 2-isopropylterephthalic acid, 2-butylterephthalic acid, 2-isobutylterephthalic acid, 2-hydroxyterephthalic acid, 2,6-dihydroxyterephthalic acid, 2,6-dimethylterephthalic acid, 2-nitroterephthalic acid, 1,2,3-benzenetricarboxylic acid, 1,2,4-benzenetricarboxylic acid (trimellitic acid), 1,2,5-benzenetricarboxylic acid, 1,3,4-benzenetricarboxylic acid, 1,3,5-benzenetricarboxylic acid (trimesic acid), 4-hydroxy-1,2,3-benzenetricarboxylic acid, 5-hydroxy-1,2,3-benzenetricarboxylic acid, 3-hydroxy-1,2,4-benzenetricarboxylic acid, 5-hydroxy-1,2,4-benzenetricarboxylic acid, 6-hydroxy-1,2,4-benzenetricarboxylic acid, 1,2,4,5-benzenetetracarboxylic acid (pyromellitic acid);

1-naphthoic acid, 2-naphthoic acid, 2-methyl-1-naphthoic acid, 3-methyl-1-naphthoic acid, 4-methyl-1-naphthoic acid, 5-methyl-1-naphthoic acid, 6-methyl-1-naphthoic acid, 7-methyl-1-naphthoic acid, 8-methyl-1-naphthoic acid, 1-methyl-2-naphthoic acid, 3-methyl-2-naphthoic acid, 4-methyl-2-naphthoic acid, 5-methyl-2-naphthoic acid, 6-methyl-2-naphthoic acid, 7-methyl-2-naphthoic acid, 8-methyl-2-naphthoic acid, 1,2-naphthalene dicarboxylic acid, 1,3-naphthalene dicarboxylic acid, 1,4-naphthalene dicarboxylic acid, 1,5-naphthalene dicarboxylic acid, 1,6-naphthalene dicarboxylic acid, 1,7-naphthalene dicarboxylic acid, 1,8-naphthalene dicarboxylic acid, 2,3-naphthalene dicarboxylic acid, 2,4-naphthalene dicarboxylic acid, 2,5-naphthalene dicarboxylic acid, 2,6-naphthalene dicarboxylic acid, 2,7-naphthalene dicarboxylic acid, 2,8-naphthalene dicarboxylic acid, 2-hydroxy-1-naphthoic acid, 3-hydroxy-1-naphthoic acid, 4-hydroxy-1-naphthoic acid, 5-hydroxy-1-naphthoic acid, 6-hydroxy-1-naphthoic acid, 7-hydroxy-1-naphthoic acid, 8-hydroxy-1-naphthoic acid, 1-hydroxy-2-naphthoic acid, 3-hydroxy-2-naphthoic acid, 4-hydroxy-2-naphthoic acid, 5-hydroxy-2-naphthoic acid, 6-hydroxy-2-naphthoic acid, 7-hydroxy-2-naphthoic acid, 8-hydroxy-2-naphthoic acid, 1,2,4,5-naphthalene tetracarboxylic acid, 2,3-dihydroxy-1-naphthoic acid, 2,4-dihydroxy-1-naphthoic acid, 2,5-dihydroxy-1-naphthoic acid, 2,6-dihydroxy-1-naphthoic acid, 2,7-dihydroxy-1-naphthoic acid, 2,8-dihydroxy-1-naphthoic acid, 3,4-dihydroxy-1-naphthoic acid, 3,5-dihydroxy-1-naphthoic acid, 3,6-dihydroxy-1-naphthoic acid, 3,7-dihydroxy-1-naphthoic acid, 3,8-dihydroxy-1-naphthoic acid, 4,5-dihydroxy-1-naphthoic acid, 4,6-hydroxy dihydroxy naphthoic acid, 4,7-dihydroxy-1-naphthoic acid, 4,8-dihydroxy-1-naphthoic acid, 5,6-dihydroxy-1-naphthoic acid, 5,7-dihydroxy-1-naphthoic acid, 5,8-dihydroxy-1-naphthoic acid, 6,7-dihydroxy-1-naphthoic acid, 6,8-dihydroxy-1-naphthoic acid, 7,8-dihydroxy-1-naphthoic acid, 1,3-dihydroxy-2-naphthoic acid, 1,4-dihydroxy-2-naphthoic acid, 1,5-dihydroxy-2-naphthoic acid, 1,6-dihydroxy-2-naphthoic acid, 1,7-dihydroxy-2-naphthoic acid, 1,8-dihydroxy-2-naphthoic acid, 3,4-dihydroxy-2-naphthoic acid, 3,5-dihydroxy-2-naphthoic acid, 3,6-dihydroxy-2-naphthoic acid, 3,8-dihydroxy-2-naphthoic acid, 4,5-dihydroxy-2-naphthoic acid, 4,6-dihydroxy-2-naphthoic acid, 4,7-dihydroxy-2-naphthoic acid, 4,8-dihydroxy-2-naphthoic acid, 5,6-dihydroxy-2-naphthoic acid, 5,7-dihydroxy-2-naphthoic acid, 5,8-dihydroxy-2-naphthoic acid, 6,7-dihydroxy-2-naphthoic acid, 6,8-dihydroxy-2-naphthoic acid, 7,8-dihydroxy-2-naphthoic acid, cyclohexanecarboxylic acid, 1,2-cyclohexanedicarboxylic acid, 1,3-cyclohexanedicarboxylic acid, 1,4-cyclohexanedicarboxylic acid, 1,1-cyclohexanedicarboxylic acid, 1,2-decahydronaphthalene dicarboxylic acid, 1,3-decahydronaphthalene dicarboxylic acid, 1,4-decahydronaphthalene dicarboxylic acid, 1,5-decahydronaphthalene dicarboxylic acid, 1,6-decahydronaphthalene dicarboxylic acid, 1,7-decahydronaphthalene dicarboxylic acid, 1,8-decahydronaphthalene dicarboxylic acid, etc.

These aromatic carboxylic acid compounds may be used alone or by combining two or more kinds.

Among these, it is preferred to be an aromatic carboxylic acid compound represented by formula (I-1)

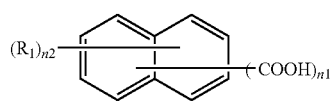

(wherein n1 represents any integer of 1 to 4; n2 represents any integer of 0 to 4; $R_1$ represents C1-6 alkyl group, nitro group or hydroxy group);
or formula (I-2)

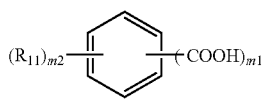

(wherein m1 represents any integer of 1 to 4; m2 represents any integer of 0 to 2; $R_{11}$ represents C1-6 alkyl group, nitro group, hydroxy group or the following formula

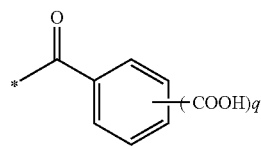

(wherein q represents an integer of 1 or 2; * represents a binding position).

Examples of C1-6 alkyl group of $R_1$ and $R_{11}$ include a methyl group, ethyl group, propyl group, isopropyl group, cyclopropyl group, butyl group, isobutyl group, s-butyl group, t-butyl group, cyclobutyl group, cyclopropylmethyl group, pentyl group, isopentyl group, 2-methylbutyl group, neopentyl group, 1-ethylpropyl group, hexyl group, isohexyl group, 4-methylpentyl group, 3-methylpentyl group, 2-methylpentyl group, 1-methylpentyl group, 3,3-dimethylbutyl group, 2,2-dimethylbutyl group, etc.

Further, among these, it is preferred to be at least one selected from the group consisting of 3,5-dihydroxybenzoic acid, isophthalic acid, terephthalic acid, 5-t-butyl isophthalic acid, 5-nitroisophthalic acid, 5-hydroxyisophthalic acid, trimellitic acid, trimesic acid, pyromellitic acid, 2,6-naphthalene dicarboxylic acid, 1,4-naphthalene dicarboxylic acid and benzophenone-4,4'-dicarboxylic acid.

The imidazole compound is not particularly limited as long as it is a compound represented by formula (II)

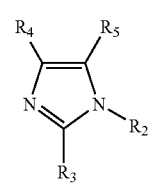

(wherein $R_2$ represents a hydrogen atom, C1-C10 alkyl group, phenyl group, benzyl group or cyanoethyl group; $R_3$ to $R_5$ represent a hydrogen atom, nitro group, halogen atom, C1-C20 alkyl group, phenyl group, benzyl group, hydroxymethyl group or C1-C20 acyl group).

Examples of C1-C10 alkyl group of $R_2$ include a methyl group, ethyl group, propyl group, isopropyl group, cyclopropyl group, butyl group, isobutyl group, s-butyl group, t-butyl group, cyclobutyl group, cyclopropylmethyl group, pentyl group, isopentyl group, 2-methylbutyl group, neopentyl group, 1-ethylpropyl group, hexyl group, isohexyl group, 4-methylpentyl group, 3-methylpentyl group, 2-methylpentyl group, 1-methylpentyl group, 3,3-dimethylbutyl group, 2,2-dimethylbutyl group, 1,1-dimethylbutyl group, 1,2-dimethylbutyl group, 1,3-dimethylbutyl group, 2,3-dimethylbutyl group, 1-ethylbutyl group, 2-ethylbutyl group, octyl group, nonyl group, decyl group, etc.

Examples of C1-C20 alkyl group of $R_3$ to $R_5$ include an undecyl group, lauryl group, palmityl group, stearyl group, etc. besides those exemplified for alkyl group of $R_2$.

Examples of C1-C20 acyl group of $R_3$ to $R_5$ include a formyl group, acetyl group, propionyl group, butyryl group, isobutyryl group, valeryl group, pivaloyl group, hexanoyl group, octanoyl group, decanoyl group, lauroyl group, myristoyl group, palmitoyl group, stearoyl group, etc.

Examples of imidazole compounds specifically include imidazole, 1-methylimidazole, 2-methylimidazole, 3-methylimidazole, 4-methylimidazole, 5-methylimidazole, 1-ethylimidazole, 2-ethylimidazole, 3-ethylimidazole, 4-ethylimidazole, 5-ethylimidazole, 1-n-propylimidazole, 2-n-propylimidazole, 1-isopropylimidazole, 2-isopropylimidazole, 1-n-butylimidazole, 2-n-butylimidazole, 1-isobutylimidazole, 2-isobutylimidazole, 2-undecyl-1H-imidazole, 2-heptadecyl-1H-imidazole, 1,2-dimethylimidazole, 1,3-dimethylimidazole, 2,4-dimethylimidazole, 2-ethyl-4-methylimidazole, 1-phenylimidazole, 2-phenyl-1H-imidazole, 4-methyl-2-phenyl-1H-imidazole, 2-phenyl-4-methylimidazole, 1-benzyl-2-methylimidazole, 1-benzyl-2-phenylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 2-phenylimidazole isocyanurate adduct, 2-methylimidazole isocyanurate adduct, 2-phenyl-4,5-dihydroxymethylimidazole, 2-phenyl-4-methyl-5-hydroxymethylimidazole, 1-cyanoethyl-2-phenyl-4,5-di(2-cyanoethoxy)methylimidazole, 1-dodecyl-2-methyl-3-benzylimidazolium chloride, 1-benzyl-2-phenylimidazole hydrochloride, etc.

Among these, an imidazole compound which is at least one selected from the group consisting of 2-methylimidazole, 2-ethyl-4-methylimidazole, 2-undecylimidazole and 2-phenyl-4-methyl-5-hydroxymethylimidazole is preferred.

As for the clathrate complex of the above-mentioned aromatic carboxylic acid compound and the imidazole compound, the combination thereof is not limited as long as it is within the above scope. However, a clathrate complex of an aromatic carboxylic acid compound which is at least one selected from the group consisting of 3,5-dihydroxybenzoic acid, isophthalic acid, terephthalic acid, 5-t-butyl isophthalic acid, 5-nitroisophthalic acid, 5-hydroxyisophthalic acid, trimellitic acid, trimesic acid, pyromellitic acid, 2,6-naphthalene dicarboxylic acid, 1,4-naphthalene dicarboxylic acid and benzophenone-4,4'-dicarboxylic acid; and an imidazole compound which is at least one selected from the group consisting of 2-methylimidazole, 2-ethyl-4-methylimidazole, 2-undecylimidazole and 2-phenyl-4-methyl-5-hydroxymethylimidazole is more preferred.

(Novel Clathrate Complex)

In the present invention, a clathrate complex of at least one selected from the group consisting of trimesic acid, 2,6-naphthalene dicarboxylic acid, 1,4-naphthalene dicarboxylic acid and benzophenone-4,4'-dicarboxylic acid; and at least one imidazole compound represented by formula (II)

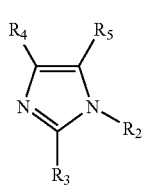

(II)

(wherein $R_2$ represents a hydrogen atom, C1-C10 alkyl group, phenyl group, benzyl group or cyanoethyl group, $R_3$ to $R_5$ represent a hydrogen atom, nitro group, halogen atom, C1-C20 alkyl group, phenyl group, benzyl group, hydroxymethyl group or C1-C20 acyl group)

is a novel clathrate complex.

As for the method for producing a clathrate complex of component (B), it can be obtained by mixing directly the above-mentioned aromatic carboxylic acid compound and the imidazole compound, or by mixing them in a solvent. Further, in case of a material with a low boiling point, or a material with a high steam pressure, the intended clathrate complex can be obtained by allowing to act the steam of these materials on the above-mentioned aromatic carboxylic acid compound. Further, by allowing to react two or more kinds of imidazole compounds with the above-mentioned aromatic carboxylic acid compound, a clathrate complex consisted of plural components of 3 components or more can be obtained. Moreover, the intended clathrate complex can be obtained by first generating a clathrate complex of the above-mentioned aromatic carboxylic acid compound and an imidazole compound, and then allowing to react this clathrate complex with another imidazole compound by a method such as mentioned in the above.

The structure of the obtained clathrate complex can be confirmed by thermal analysis (TG and DTA), infrared absorption spectrometry (IR), X-ray diffraction pattern, solid NMR spectrum, etc. Further, the composition of the clathrate complex can be confirmed by thermal analysis, $^1$H-NMR spectrometry, high performance liquid chromatography (HPLC), element analysis, etc.

The 50% particle diameter of the clathrate complex of component (B) is not particularly limited, and it is usually within about 0.01 to 80 μm, preferably about 0.01 to 30 μm, and more preferably about 0.1 to 20 μm. Those which average particle diameter exceeds about 80 μm are not preferred, as the clathrate complex particle cannot get in between the wirings of a semiconductor when sealing.

The 50% particle diameter is the particle diameter in μm when the cumulative curve calculated by setting the particle population as 100% is 50%.

The epoxy resin composition of the present invention suffices to contain the above component (A) and component (B), and it may be a solid epoxy resin composition for sealing a semiconductor comprising an inorganic filler (C), in addition to component (A) and component (B).

The inorganic filler (C) of the solid epoxy resin composition for sealing a semiconductor of the present invention is not particularly limited, and examples include silica glass, spherical silica obtained by flame melting, spherical silica produced by zol-gel method, etc. crystalline silica, alumina, tarc, ammonium nitrate, silicon nitrate, magnesia, magnesium silicate, etc. These may be used alone or by combining 2 or more kinds.

In the epoxy resin composition of the present invention, component (B) is used as a curing agent or a curing accelerator. When component (B) is a curing accelerator, it may further contain a curing agent. The curing agent is not particularly limited as long as it is a compound that cures epoxy resin by reacting with the epoxy group in epoxy resin. As such curing agents, any of those commonly used as a conventional curing agent of epoxy resin can be selected and used. Examples include amine compounds such as aliphatic amines, alicyclic and heterocyclic amines, aromatic amines, and denatured amines; imidazole compounds, imidazoline compounds, amide compounds, ester compounds, phenol compounds, alcohol compounds, thiol compounds, ether compounds, thioether compounds, urea compounds, thiourea compounds, Lewis acid compounds, phosphorus compounds, acid-anhydride compounds, onium salt compounds, active silicon compound-aluminum complex, etc.

As for curing agent and curing accelerator, the following compounds can be specifically exemplified.

Examples of aliphatic amines include ethylenediamine, trimethylenediamine, triethylenediamine, tetramethylenediamine, hexamethylenediamine, diethylenetriamine, triethylenetetramine, tetraethylene pentamine, dipropylene diamine, dimethylaminopropylamine, diethylaminopropylamine, trimethylhexamethylenediamine, pentanediamine, bis(2-dimethylaminoethyl)ether, pentamethyldiethylenetriamine, alkyl-t-monoamine, 1,4-diazabicyclo(2,2,2)octane(triethylenediamine), N,N,N',N'-tetramethylhexamethylenediamine, N,N,N',N'-tetramethylpropylenediamine, N,N,N',N'-tetramethylethylenediamine, N,N-dimethylcyclohexylamine, dibutylaminopropylamine, dimethylaminoethoxyethoxyethanol, triethanolamine, dimethylaminohexanol, etc.

Examples of alicyclic and heterocyclic amines include piperidine, piperazine, menthanediamine, isophorone diamine, methylmorpholine, ethylmorpholine, N,N',N''-tris(dimethylaminopropyl)hexahydro-s-triazine, 3,9-bis(3-aminopropyl)-2,4,8,10-tetraoxyspiro(5,5)undecane adduct, N-aminoethylpiperazine, trimethylaminoethylpiperazine, bis(4-aminocyclohexyl)methane, N,N'-dimethylpiperazine, 1,8-diazabicyclo(4,5,0)undecene-7, etc.

Examples of aromatic amines include o-phenylenediamine, m-phenylenediamine, p-phenylenediamine, diaminodiphenylmethane, diaminodiphenylsulfone, benzylmethylamine, dimethylbenzylamine, m-xylylenediamine, pyridine, picoline, α-methylbenzylmethylamine, etc.

Examples of denatured amines include epoxy compound-added polyamine, Michael added-polyamine, Mannich added-polyamine, thiourea-added polyamine, ketone blocked polyamine, dicyandiamide, guanidine, organic acid hydrazide, diamino maleonitrile, amineimide, boron trifluoride-piperidine complex, boron trifluoride-monoethylamine complex, etc.

Examples of imidazole compounds include imidazole, 1-methylimidazole, 2-methylimidazole, 3-methylimidazole, 4-methylimidazole, 5-methylimidazole, 1-ethylimidazole, 2-ethylimidazole, 3-ethylimidazole, -ethylimidazole, 5-ethylimidazole, 1-n-propylimidazole, 2-n-propylimidazole, 1-isopropylimidazole, 2-isopropylimidazole, 1-n-butylimidazole, 2-n-butylimidazole, 1-isobutylimidazole, 2-isobutylimidazole, 2-undecyl-1H-imidazole, 2-heptadecyl-1H-imidazole, 1,2-dimethylimidazole, 1,3-dimethylimidazole, 2,4-dimethylimidazole, 2-ethyl-4-methylimidazole, 1-phenylimidazole, 2-phenyl-1H-imidazole, 4-methyl-2-phenyl-1H-imidazole, 2-phenyl-4-methylimidazole, 1-benzyl-2-methylimidazole, 1-benzyl-2-phenylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylomidazole, 2-phenylimidazole isocyanurate adduct, 2-methylimidazole isocyanurate adduct, 2-phenyl-4,5-dihydroxymethylimidazole, 2-phenyl-4-methyl-5-hydroxymethylimidazole, 1-cyanoethyl-2-phenyl-4,5-di(2-cyanoethoxy)methylimidazole, 1-dodecyl-2-methyl-3-benzylimidazolium chloride, 1-benzyl-2-phenylimidazole hydrochloride, etc.

Examples of imidazoline compounds include 2-methylimidazoline, 2-phenylimidazoline, etc.

Examples of amide compounds include a polyamide obtained by a condensation of a dimer acid, polyamine, etc.

Examples of ester compounds include active carbonyl compounds such as aryl ester and thioaryl ester of carboxylic acid, etc.

Examples of phenol compounds, alcohol compounds, thiol compounds, ether compounds and thioether compounds include as phenol resin curing agent, aralkyl-type phenol resin such as phenol aralkyl resin and naphtol aralkyl resin, novolac-type phenol resin such as phenol novolac resin, cresol novolac resin, denatured resin thereof such as, for example epoxylated or butylated novolac-type phenol resin etc., dicyclopentadiene denatured phenol resin, paraxylene denatured phenol resin, triphenol alkan-type phenol resin, multifunctional-type phenol resin, etc. Further, tri-2-ethylhexyl hydrochloride such as polyol, polymercaptan, polysulphide, 2-(dimethylaminomethylphenol), 2,4,6-tris(dimethylaminomethyl)phenol, 2,4,6-tris(dimethylaminomethyl) phenol, etc. can be exemplified.

Examples of urea compound, thiourea compound, Lewis acid compounds include butylated urea, butylated melamine, butylated thiourea, boron trifluoride, etc.

Examples of phosphorous compounds include organic phosphine compounds including primary phosphine such as alkyl phosphine including ethyl phosphine and butyl phosphine, phenyl phosphine, etc.; secondary phosphine such as dialkyl phosphine including dimethyl phosphine and dipropylphospine, diphenyl phosphine, methylethyl phosphine, etc.; tertiary phosphine such as trimethyl phosphine, triethyl phosphine, triphenyl phosphine, etc.

Examples of acid anhydride compounds include phthalic anhydride, tetrahydrophthalic anhydride, hexahydrophthalic anhydride, methyltetrahydrophthalic anhydride, methylhexahydrophthalic anhydride, endomethylene tetrahydrophthalic anhydride, methylendomethylene tetrahydrophthalic anhydride, maleic anhydride, tetramethylene maleic anhydride, trimellitic anhydride, chlorendic anhydride, pyromellitic anhydride, dodecenyl succinic anhydride, benzophenonetetracarboxylic anhydride, ethyleneglycol bis(anhydrotrimellitate), glyceroltris(anhydrotrimellitate), methylcyclohexene tetracarboxylic anhydride, polyazelaic anhydride, etc.

Further, examples of onium salt compound and active silicon compound-aluminum complex include aryl diazonium salt, diaryl iodonium salt, triaryl sulfonium salt, triphenyl silanol-aluminum complex, triphenyl methoxysilane-aluminum complex, silylperoxide-aluminum complex, triphenyl silanol-tris(salicyl aldehydate)aluminum complex, etc.

As for the above-mentioned curing agent, it is preferred to use particularly an amine compound, imidazole compound and phenol compound. Among the phenol compounds, it is more preferred to use a phenol resin curing agent.

As for the method for producing the epoxy resin composition for sealing a semiconductor of the present invention, it can be produced by melting and kneading the mixture comprising each of the above components and other additives in a given amount with the use of kneader, roller, extrusion molding machine, etc. at a temperature and time with which no gelatinization occurs, subsequently cooling the resultant, and then grinding and remolding the same. Further, in the method for producing the epoxy resin composition for sealing a semiconductor of the present invention, the step of melting and kneading by heating may be omitted.

The produced epoxy resin composition may be a solid or in a liquid state, depending on its composition and producing method, and it is preferred to be a solid. When using as a solid, it is preferred that the content of the inorganic filler is 70 to 95% with respect to the total epoxy resin composition.

The amount of the clathrate complex to be used may be similar to the amount used for usual curing agent and curing accelerator, and depends on the curing method. In case of an addition-type curing agent, wherein a curing agent molecule is always integrated in the cured resin by reacting with the epoxy group, while it depends on the desired property of the resin, the clathrate complex is generally used so that the included imidazole compound (curing agent and/or curing accelerator) becomes 0.3 to 1.0 mol with respect to 1 mol of the epoxy group. Further, in a case of a polymerization-type curing agent or photoinitiation-type curing agent wherein the curing agent molecule catalytically induces ring-opening of the epoxy group without being integrated in the resin, and causes addition polymerization reaction between oligomers, or in case of using as a curing accelerator, the clathrate complex suffices to be 1.0 mol or less with respect to 1 mol of epoxy group. These clathrate complexes may be used alone or by mixing two or more kinds.

Other additives may be added to the epoxy resin composition for sealing a semiconductor of the present invention according to need. Examples of the other additives include the following: silane coupling agents such as vinyltrimethoxysilane, vinyltriethoxysilane, γ-glycidoxypropyltrimethoxysilane, γ-glycidoxypropyltriethoxysilane, γ-methacryloxypropyltrimethoxysilane, γ-methacryloxypropyltriethoxysilane, γ-aminopropyltrimethoxysilane, γ-aminopropyltriethoxysilane, N-β(aminoethyl)γ-aminopropyltrimethoxysilane, N-β(aminoethyl)γ-aminopropyltriethoxysilane, N-phenyl-γ-aminopropyltrimethoxysilane, N-phenyl-γ-aminopropyltriethoxysilane, γ-mercaptopropyltrimethoxysilane, γ-mercaptopropyltriethoxysilane, etc.; fillers such as calcium bicarbonate, light calcium bicarbonate, natural silica, synthetic silica, molten silica, kaolin, clay, titanium oxide, barium sulfate, zinc oxide, aluminum hydroxide, magnesium hydroxide, talc, mica, wollastonite, potassium titanate, aluminum borate, sepiolite, xonotolite, etc.; elastomer denaturing agents such as NBR, polybutadiene, chloroprene rubber, silicone, crosslinked NBR, crosslinked BR, acryls, core-shell acryl, urethane rubber, polyester elastomer, functional group containing-liquid NBR, liquid polybutadiene, liquid polyester, liquid polysulfide, denatured silicone, urethane prepolymers, etc.;

Flame retardants such as hexabromocyclodecane, bis(dibromopropyl)tetrabromobisphenol A, tris(dibromopropyl) isocyanurate, tris(tribromoneopentyl)phosphate, decabromodiphenyl oxide, bis(pentabromo)phenylethane, tris (tribromophenoxy)triazine, ethylenebistetrabromophthalimide, polybromophenylindane, brominated polystyrene, tetrabromobisphenol A polycarbonate, brominated phenylene ethylene oxide, polypentabromobenzylacrylate, triphenylphosphate, tricresylphosphate, trixynilphosphate, cresyldiphenylphosphate, xylyldiphenylphosphate, cresylbis(di-2,6-xylenyl) phosphate, 2-ethylhexyldiphenylphosphate, resorcinolbis (diphenyl)phosphate, bisphenol A bis(diphenyl)phosphate, bisphenol A bis(dicresyl)phosphate, resorcinolbis(di-2,6-xylenyl)phosphate, tris(chloroethyl)phosphate, tris(chloropropyl)phosphate, tris(dichloropropyl)phosphate, tris(tribromopropyl)phosphate, diethyl-N,N-bis(2-hydroxyethyl) aminomethylphosphonate, aluminum hydroxide treated with oxalate anion, aluminum hydroxide treated with nitrate, aluminum hydroxide treated with high-temperature hot water, hydrated metal compound surface-treated with stannic acid, magnesium hydroxide surface-treated with nickel compound, magnesium hydroxide surface-treated with silicone polymer, procobite, multilayer surface-treated hydrated metal compound, magnesium hydroxide treated with cation polymer, etc.; engineering plastics such as high density polyethylene, polypropylene, polystyrene, polymethyl methacrylate, polyvinyl chloride, nylon-6,6, polyacetal, polyethersulphone, polyetherimide, polybutylene terephtalate, polyether etherketone, polycarbonate, polysulphone, etc.; plasticizers; diluents such as n-butylglycidylether, phenylglycidylether, styrene oxide, t-butylphenylglycidylether, dicyclopentadiene diepoxide, phenol, cresol, t-butylphenol, etc.; extender; strengthening agent; coloring agent; thickening agent; mold lubricant such as higher fatty acid, higher fatty acid ester, higher fatty acid calcium, etc., including carnauba wax and polyethylene wax, etc. The compounding amount of these additives is not particularly limited, and the compounding amount can be appropriately determined within the limit that the effect of the present invention may be obtained.

Further, the epoxy resin composition for sealing a semiconductor of the present invention can contain other resins, besides epoxy resin. Examples of other resins include polyester resin, acryl resin, silicon resin, polyurethane resin, etc.

EXAMPLES

Examples are shown in the following, while the present invention is not limited to these Examples.

Preparation of Clathrate Complex

Clathrate complexes were prepared with the combinations shown in the following Tables 1 to 5. Preparation of each clathrate complex was performed by the methods shown in Example 2, Example 3 and Example 17, and similar methods.

Example 2

To a 3 L-three neck flask, 180.0 g of 5-tert butyl isophthalic acid and 107.1 g of 2-ethyl-4-methylimidazole, and 810 ml of methanol were added, stirred and heated at reflux for 3 hours. After cooling, by performing filtration and vacuum drying, 201.3 g of the clathrate complex of 5-tert-butyl isophthalic acid/2-ethyl-4-methylimidazole (1:1) was obtained. The clathration of the obtained clathrate complex was confirmed by $^1$H-NMR, TG-DTA and XRD.

Clathrate complexes of Examples 5, 9, 12, 13, 14, 18, 23, 28, 29, 31, 33, 34, 35, 36, 38, 39, 40, 43, 44 and 45 were prepared in the same manner.

Example 3

To a 500 ml-three neck flask, 49.8 g of isophthalic acid and 300 ml of acetone were added and stirred. Thereto, 33.1 g of 2-ethyl-4-methylimidazole dissolved separately with 60 ml of acetone was dropped by heating. After dropping, the resultant was heated at reflux for 3 hours, cooled, and then subjected to suction filtration. By performing vacuum drying, 79.2 of the clathrate complex of isophthalic acid/2-ethyl-4-methylimidazole (1:1) was obtained. The clathration of the obtained clathrate complex was confirmed by $^1$H-NMR, TG-DTA and XRD.

Clathrate complexes of Examples 1, 8, 10, 11, 19, 21, 30, 37 and 46 were prepared in the same manner.

Example 17

To a 3 L-three neck flask, 43.2 g of 1,4-naphthalenedicarboxylic acid and 44.5 g of 2-undecylimidazole, and 1000 ml of ethyl acetate were added, stirred and heated at reflux for 3 hours. After cooling, by performing filtration and vacuum drying, 85.9 of the clathrate complex of 1,4-naphthalenedicarboxylic acid/2-undecylimidazole (1:1) was obtained. The obtained clathrate complex was subjected to $^1$H-NMR, TG-DTA and XRD to confirm the clathration.

Clathrate complexes of Examples 4, 20, 22, 27, 32 and 41 were prepared in the same manner.

In Tables 1 to 5, "2E4MZ" denotes 2-ethyl-4-methylimidazole, "2MZ" denotes 2-methylimidazole, "C11Im" denotes 2-undecylimidazole, "2P4 MHZ" denotes 2-phenyl-4-methyl-5-hydroxymethylimidazole, and "C17Im" denotes 2-heptadecylimidazole.

TABLE 1

|  | Ex. 1 | Ex. 2 | Ex. 3 | Ex. 4 | Ex. 5 | Ex. 6 | Ex. 7 |
|---|---|---|---|---|---|---|---|
| No. | S1 | S2 | S3 | S4 | S5 | S6 | S7 |
| imidazole | 2E4MZ | 2E4MZ | 2E4MZ | 2E4MZ | 2E4MZ | 2E4MZ | 2E4MZ |
| Aromatic carboxylic acid | 2,6-naphthalene dicarboxylic acid | 5-tert butyl isophthalic acid | isophthalic acid | benzophenone-4,4'-dicarboxylic acid | 5-nitroisophthalic acid | terephthalic acid | 3,5-dihydroxy-2-naphthoic acid |
| Host:imidazole | 1:1 | 1:1 | 1:1 | 2:3 | 1:1 | 1:1 | 1:1 |

TABLE 1-continued

|  | Ex. 1 | Ex. 2 | Ex. 3 | Ex. 4 | Ex. 5 | Ex. 6 | Ex. 7 |
| --- | --- | --- | --- | --- | --- | --- | --- |
| Carboxylic acid (mmol) | 400 | 810 | 300 | 144 | 800 | 200 | 200 |
| Imidazole (mmol) | 400 | 972 | 300 | 288 | 960 | 200 | 200 |
| Solvent | acetone | methanol | acetone | ethyl acetate | methanol | methanol | methanol |
| Solvent amount (ml) | 400 | 810 | 360 | 315 | 1200 | 150 | 150 |
| Obtained amount (g) | 121.2 | 201.3 | 79.2 | 55.9 | 225.7 | 46.7 | 46.7 |

TABLE 2

|  | Ex. 8 | Ex. 9 | Ex. 10 | Ex. 11 | Ex. 12 | Ex. 13 | Ex. 14 | Ex. 15 | Ex. 16 |
| --- | --- | --- | --- | --- | --- | --- | --- | --- | --- |
| No. | S8 | S9 | S10 | S11 | S12 | S13 | S14 | S15 | S16 |
| imidazole | 2MZ | 2MZ | 2MZ | 2MZ | 2MZ | 2MZ | 2MZ | 2MZ | 2MZ |
| Aromatic carboxylic acid | 2,6-naphthalene dicarboxylic acid | 5-nitroisophthalic aicd | 5-tert-butyl isophthalic acid | benzophenone-4,4'-dicarboxylic acid | isophthalic acid | 3,5-dihydroxy-benzoic acid | trimesic acid | 5-hydroxy isophthalic acid | terephthalic acid |
| Host:imidazole | 1:1 | 1:2 | 1:1 | 2:3 | 1:1 | 1:1 | 1:1 | 1:1 | 1:1 |
| Carboxylic acid (mmol) | 320 | 400 | 200 | 161 | 375 | 300 | 250 | 100 | 240 |
| Imidazole (mmol) | 320 | 800 | 200 | 322 | 375 | 300 | 250 | 100 | 360 |
| Solvent | acetone | methanol | acetone | acetone | methanol | methanol | methanol | methanol | methanol |
| Solvent amount (ml) | 800 | 1000 | 390 | 210 | 500 | 600 | 500 | 100 | 170 |
| Obtained amount (g) | 94.1 | 133.2 | 57.4 | 63.0 | 78.4 | 54.3 | 69.1 | 21.0 | 41.5 |

TABLE 3

|  | Ex. 17 | Ex. 18 | Ex. 19 | Ex. 20 | Ex. 21 | Ex. 22 | Ex. 23 |
| --- | --- | --- | --- | --- | --- | --- | --- |
| No. | S17 | S18 | S19 | S20 | S21 | S22 | S23 |
| imidazole | C11Im | C11Im | C11Im | C11Im | C11Im | C11Im | C11Im |
| Aromatic carboxylic acid | 1,4-naphthalene dicarboxylic acid | trimesic acid | 5-tert-butyl isophthalic acid | isophthalic acid | trimellic acid | 5-nitroisophthalic acid | pyromellitic acid |
| Host:imidazole | 1:1 | 2:3 | 1:1 | 1:1 | 1:1 | 1:1 | 1:1 |
| Carboxylic acid (mmol) | 400 | 120 | 250 | 200 | 160 | 150 | 250 |
| Imidazole (mmol) | 200 | 180 | 250 | 200 | 160 | 150 | 250 |
| Solvent | ethyl acetate | methanol | acetone | ethyl acetate | acetone | ethyl acetate | methanol |
| Solvent amount (ml) | 1000 | 320 | 250 | 1000 | 1000 | 750 | 1000 |
| Obtained amount (g) | 85.9 | 56.5 | 108.0 | 68.1 | 64.8 | 62.9 | 92.2 |

|  | Ex. 24 | Ex. 25 | Ex. 26 |
| --- | --- | --- | --- |
| No. | S24 | S25 | S26 |
| imidazole | C11Im | C11Im | C11Im |
| Aromatic carboxylic acid | benzophenone-4,4'-dicarboxylic acid | 3,5-dihydroxy benzoic acid | 5-hydroxy isophthalic acid |
| Host:imidazole | 1:1 | 1:1 | 1:1 |
| Carboxylic acid (mmol) | 14.8 | 150 | 100 |
| Imidazole (mmol) | 14.8 | 150 | 100 |
| Solvent | ethyl acetate | acetone | methanol |
| Solvent amount (ml) | 30 | 250 | 50 |
| Obtained amount (g) | 7.0 | 51.5 | 23.5 |

TABLE 4

|  | Ex. 27 | Ex. 28 | Ex. 29 | Ex. 30 | Ex. 31 |
| --- | --- | --- | --- | --- | --- |
| No. | S27 | S28 | S29 | S30 | S31 |
| imidazole | 2P4MHZ | 2P4MHZ | 2P4MHZ | 2P4MHZ | 2P4MHZ |
| Aromatic carboxylic acid | 1-4,naphthalene dicarboxylic acid | 2,6-naphthalene dicarboxylic acid | 5-nitroisophthalic acid | 5-tert-butyl isophthalic acid | isophthalic acid |
| Host:imidazole | 1:2 | 1:2 | 1:2 | 1:1 | 1:2 |
| Carboxylic acid (mmol) | 200 | 100 | 200 | 150 | 180 |
| Imidazole (mmol) | 400 | 200 | 400 | 150 | 360 |
| Solvent | ethyl acetate | methanol | methanol | acetone | methanol |
| Solvent amount (ml) | 850 | 200 | 600 | 750 | 500 |
| Obtained amount (g) | 117.4 | 54.7 | 113.9 | 56.5 | 85.9 |
|  | Ex. 32 | Ex. 33 | Ex. 34 | Ex. 35 | Ex. 36 |
| No. | S32 | S33 | S34 | S35 | S36 |
| imidazole | 2P4MHZ | 2P4MHZ | 2P4MHZ | 2P4MHZ | 2P4MHZ |
| Aromatic carboxylic acid | benzophenone-4,4'-dicarboxylic acid | terephthalic acid | trimellic acid | trimesic acid | pyromellic acid |
| Host:imidazole | 2:1 | 1:1 | 1:1 | 1:1 | 1:2 |
| Carboxylic acid (mmol) | 112 | 200 | 220 | 220 | 200 |
| Imidazole (mmol) | 56 | 200 | 220 | 220 | 400 |
| Solvent | ethyl acetate | methanol | methanol | methanol | methanol |
| Solvent amount (ml) | 35 | 400 | 1330 | 1200 | 1000 |
| Obtained amount (g) | 39.9 | 59.5 | 79.1 | 61.5 | 125.0 |

TABLE 5

|  | Ex. 37 | Ex. 38 | Ex. 39 | Ex. 40 | Ex. 41 | Ex. 42 |
| --- | --- | --- | --- | --- | --- | --- |
| No. | S37 | S38 | S39 | S40 | S41 | S42 |
| imidazole | 2P4MHZ | 2P4MHZ | 2MZ | 2MZ | 2MZ | 2E4MZ |
| Aromatic carboxylic acid | 3,5-dihydroxy benzoic acid | 5-hydroxy isophthalic acid | pyromellic acid | trimellic acid | 1,4-naphthalene dicarboxylic acid | 3,5-dihyrdroxy benzoic acid |
| Host:imidazole | 2:3 | 1:1 | 1:1 | 1:1 | 1:1 | 1:1 |
| Carboxylic acid (mmol) | 200 | 200 | 300 | 240 | 200 | 250 |
| Imidazole (mmol) | 200 | 200 | 300 | 240 | 200 | 500 |
| Solvent | acetone | methanol | methanol | methanol | ethyl acetate | acetone + methanol |
| Solvent amount (ml) | 600 | 230 | 500 | 300 | 600 | 1000 + 100 |
| Obtained amount (g) | 55.0 | 64.6 | 95.5 | 58.4 | 55.2 | 54.3 |
|  | Ex. 43 | Ex. 44 | Ex. 45 | Ex. 46 | Ex. 47 | Ex. 48 |
| No. | S43 | S44 | S45 | S46 | S47 | S48 |
| imidazole | 2E4MZ | 2E4MZ | 2E4MZ | 2E4MZ | C17Im | C17Im |
| Aromatic carboxylic acid | trimesic acid | pyromellic acid | trimellic acid | 1-4-naphthalene dicarboxyllic acid | isophthalic acid | trimellic acid |
| Host:imidazole | 1:1 | 1:2 | 1:1 | 1:1 | 1:1 | 1:1 |
| Carboxylic acid (mmol) | 480 | 200 | 300 | 200 | 100 | 20 |
| Imidazole (mmol) | 480 | 400 | 300 | 200 | 100 | 20 |
| Solvent | methanol | methanol | methanol | acetone | methanol | methanol |
| Solvent amount (ml) | 800 | 200 | 200 | 650 | 200 | 40 |
| Obtained amount (g) | 128.0 | 86.6 | 72.4 | 63.1 | 39.3 | 8.9 |

Production of Epoxy Resin Composition

The clathrate complexes of the Examples were used as curing catalyst, and compounded at a composition rate shown in Tables 6 to 11, respectively, and the mixture was heated at reflux at 100° C. for 5 minutes, cooled and ground to produce the epoxy resin composition for sealing a semiconductor. The compounding amount of each composition in the Tables is shown by part by weight.

Further, as comparative examples, imidazole compounds that are not clathrate complex were used to produce similarly a epoxy resin composition for sealing a semiconductor at a composition rate shown in Table 12.

(Spiral Flow Test)

The epoxy resin composition of each Example was tableted, to mold tablets. These tablets were subjected to injection molding by using Archimedes spiral mold and transfer molding machine, under a condition of 175° C. at a pressure of 70 Kgf/cm² for 3 minutes, and their length was measured. The spiral flow levels were measured for the initiation level and the level after 96 hours at 30° C., and the retention rate (%) was calculated from these levels.

(Gelation Time)

It was measured using a gelation test apparatus at 175° C.

ESCN195LL epoxy equivalent 195 (Sumitomo Chemical Co., Ltd.) was used for o-cresol novolac epoxy resin, PSM-4261 OH equivalent 103 (Gunei Chemical Industry, Co. Ltd.) was used for novolac phenol, refined granular carnauba (Toakasei Co., Ltd.) was used as mold lubricant, KBM-403 (Shin-Etsu Chemical Co., Ltd.) was used as coupling agent, and DENKA FB-940A spherical silica (Denki Kagaku Kogyo K.K) was used as silica.

TABLE 6

|  | Ex. 49 | Ex. 50 | Ex. 51 | Ex. 52 |
|---|---|---|---|---|
| Clathrate complex No. | S1 | S2 | S4 | S5 |
| o-cresol novolac epoxy | 100 | 100 | 100 | 100 |
| Novolac phenol | 50 | 50 | 50 | 50 |

TABLE 6-continued

|  | Ex. 49 | Ex. 50 | Ex. 51 | Ex. 52 |
|---|---|---|---|---|
| Mold lubricant | 2 | 2 | 2 | 2 |
| Coupling agent | 5 | 5 | 5 | 5 |
| Silica | 900 | 900 | 900 | 900 |
| Curing catalyst | 5.926 | 6.035 | 5.405 | 5.834 |
| Spiral flow level (initial value) [cm] | 117.5 | 127.2 | 117.7 | 155 |
| Spiral flow level (30° C. × after 96 h) [cm] | 67.8 | 85.8 | 61.2 | 146.5 |
| Retention rate 96 h after spiral flow | 57.7% | 67.5% | 52.0% | 94.5% |
| Gelation time [s] | 22 | 22.6 | 26.1 | 28.7 |

TABLE 7

|  | Ex. 53 | Ex. 54 | Ex. 55 | Ex. 56 | Ex. 57 | Ex. 58 |
|---|---|---|---|---|---|---|
| Clathrate complex No. | S8 | S9 | S10 | S11 | S13 | S14 |
| o-cresol novolac epoxy | 100 | 100 | 100 | 100 | 100 | 100 |
| Novolac phenol | 50 | 50 | 50 | 50 | 50 | 50 |
| Mold lubricant | 2 | 2 | 2 | 2 | 2 | 2 |
| Coupling agent | 5 | 5 | 5 | 5 | 5 | 5 |
| Silica | 900 | 900 | 900 | 900 | 900 | 900 |
| Curing catalyst | 7.267 | 4.572 | 7.414 | 5.97 | 5.754 | 7.119 |
| Spiral flow level (initial value) [cm] | 43.7 | 68.7 | 72.3 | 75.2 | 99.8 | 170.0 |
| Spiral flow level (30° C. × after 96 h) [cm] | 33.2 | 29.8 | 54.2 | 36.5 | 76.3 | 170.5 |
| Retention rate of spiral flow after 96 h | 76.0% | 43.4% | 75.0% | 48.5% | 76.5% | 100.3% |
| Gelation time [s] | 15.9 | 18.4 | 20.2 | 20.2 | 24.5 | 41.5 |

TABLE 8

|  | Ex. 59 | Ex. 60 | Ex. 61 | Ex. 62 | Ex. 63 | Ex. 64 | Ex. 65 |
|---|---|---|---|---|---|---|---|
| Clathrate complex No. | S17 | S18 | S19 | S20 | S21 | S22 | S23 |
| o-cresol novolac epoxy | 100 | 100 | 100 | 100 | 100 | 100 | 100 |
| Novolac phenol | 50 | 50 | 50 | 50 | 50 | 50 | 50 |
| Mold lubricant | 2 | 2 | 2 | 2 | 2 | 2 | 2 |
| Coupling agent | 5 | 5 | 5 | 5 | 5 | 5 | 5 |
| Silica | 900 | 900 | 900 | 900 | 900 | 900 | 900 |
| Curing catalyst | 3.945 | 3.261 | 3.999 | 3.494 | 3.89 | 3.899 | 4.286 |
| Spiral flow level (initial value) [cm] | 156.7 | 156.2 | 157.3 | 160.5 | 157.2 | 168.7 | 193.8 |
| Spiral flow level (30° C. × after 96 h) [cm] | 94.2 | 125.2 | 97.8 | 105.2 | 119.5 | 145 | 198.3 |
| Retention rate of spiral flow after 96 h | 60.1% | 80.2% | 62.2% | 65.5% | 76.0% | 86.0% | 102.3% |
| Gelation time [s] | 33.2 | 33.6 | 34.1 | 38.1 | 40.3 | 42.3 | 58.5 |

TABLE 9

|  | Ex. 66 | Ex. 67 | Ex. 68 | Ex. 69 |
|---|---|---|---|---|
| Clathrate complex No. | S27 | S28 | S29 | S30 |
| o-cresol novolac epoxy | 100 | 100 | 100 | 100 |
| Novolac phenol | 50 | 50 | 50 | 50 |
| Mold lubricant | 2 | 2 | 2 | 2 |
| Coupling agent | 5 | 5 | 5 | 5 |
| Silica | 900 | 900 | 900 | 900 |
| Curing catalyst | 3.149 | 3.149 | 4.244 | 4.361 |
| Spiral flow level (initial value) [cm] | 158.5 | 151.2 | 170.5 | 192.7 |
| Spiral flow level (30° C. × after 96 h) [cm] | 99.8 | 104.8 | 165 | 148.8 |

TABLE 9-continued

|  | Ex. 66 | Ex. 67 | Ex. 68 | Ex. 69 |
|---|---|---|---|---|
| Retention rate of spiral flow after 96 h | 63.0% | 69.3% | 96.8% | 77.2% |
| Gelation time [s] | 37.7 | 38 | 39.8 | 43.4 |

TABLE 10

|  | Ex. 70 | Ex. 71 | Ex. 72 | Ex. 73 |
|---|---|---|---|---|
| Clathrate complex No. | S31 | S32 | S33 | S34 |
| o-cresol novolac epoxy | 100 | 100 | 100 | 100 |
| Novolac phenol | 50 | 50 | 50 | 50 |
| Mold lubricant | 2 | 2 | 2 | 2 |
| Coupling agent | 5 | 5 | 5 | 5 |
| Silica | 900 | 900 | 900 | 900 |
| Curing catalyst | 2.884 | 7.752 | 3.765 | 4.233 |
| Spiral flow level (initial value) [cm] | 172.7 | 185.0 | 196.0 | 184.7 |
| Spiral flow level (30° C. × after 96 h) [cm] | 137.2 | 104 | 169.5 | 188.3 |
| Retention rate of spiral flow after 96 h | 79.4% | 56.2% | 86.5% | 101.9% |
| Gelation time [s] | 44 | 47.6 | 52.1 | 60 |

TABLE 11

|  | Ex. 74 | Ex. 75 | Ex. 76 | Ex. 77 | Ex. 78 | Ex. 79 | Ex. 80 |
|---|---|---|---|---|---|---|---|
| Clathrate complex No. | S37 | S38 | S41 | S42 | S43 | S44 | S46 |
| o-cresol novolac epoxy | 100 | 100 | 100 | 100 | 100 | 100 | 100 |
| Novolac phenol | 50 | 50 | 50 | 50 | 50 | 50 | 50 |
| Mold lubricant | 2 | 2 | 2 | 2 | 2 | 2 | 2 |
| Coupling agent | 5 | 5 | 5 | 5 | 5 | 5 | 5 |
| Silica | 900 | 900 | 900 | 900 | 900 | 900 | 900 |
| Curing catalyst | 3.092 | 3.935 | 7.267 | 4.798 | 5.815 | 4.307 | 5.925 |
| Spiral flow level (initial value) [cm] | 182.5 | 199.7 | 74.5 | 98.7 | 123.3 | 160.8 | 117 |
| Spiral flow level (30° C. × after 96 h) [cm] | 122.8 | 188.5 | 40 | 59.5 | 135.5 | 169.7 | 77.2 |
| Retention rate of spiral flow after 96 h | 67.3% | 94.4% | 53.7% | 60.3% | 109.9% | 105.5% | 66.0% |
| Gelation time [s] | 37.8 | 47.2 | 18.4 | 24.0 | 40.1 | 44.2 | 28.6 |

TABLE 12

| Comparative Examples | | | | |
|---|---|---|---|---|
|  | Comp. Ex. 1 | Comp. Ex. 2 | Comp. Ex. 3 | Comp. Ex. 4 |
| Imidazole compound | 2E4MZ | 2MZ | C11Im | 2P4MHZ |
| o-cresol novolac epoxy | 100 | 100 | 100 | 100 |
| Novolac phenol | 50 | 50 | 50 | 50 |
| Mold lubricant | 2 | 2 | 2 | 2 |
| Coupling agent | 5 | 5 | 5 | 5 |
| Silica | 900 | 900 | 900 | 900 |
| Curing catalyst | 2 | 2 | 2 | 2 |
| Spiral flow level (initial value) [cm] | 50.3 | 19.2 | 121.5 | 153.7 |

TABLE 12-continued

| | Comparative Examples | | | |
|---|---|---|---|---|
| | Comp. Ex. 1 | Comp. Ex. 2 | Comp. Ex. 3 | Comp. Ex. 4 |
| Spiral flow level (30° C. × after 96 h) [cm] | 24.5 | 14.7 | 64 | 61.8 |
| Retention rate of spiral flow after 96 h | 48.7% | 76.6% | 52.7% | 40.2% |
| Gelation time [s] | 11.5 | 7.6 | 24.2 | 32.4 |

In the Table, "2E4MZ" denotes 2-ethyl-4-methylimidazole, "2MZ" denotes 2-methylimidazole, "C11Im" denotes 2-undecylimidazole, and "2P4 MHZ" denotes 2-phenyl-4-methyl-5-hydroxymethylimidazole.

INDUSTRIAL APPLICABILITY

By using the epoxy resin composition for sealing a semiconductor of the present invention, it is possible to ensure storage stability of a sealant that is applicable to delicate semiconductor pathway, retain the flowability of the sealant when sealing, and to cure the sealant effectively.

The invention claimed is:

1. An epoxy resin composition comprising the following component (A) and component (B):
   (A) an epoxy resin; and
   (B) a clathrate complex that shows an X-ray diffraction pattern, the clathrate complex comprising:
   (b1) at least one aromatic carboxylic acid compound selected from the group consisting of 2,6-naphthalene dicarboxylic acid, 1,4-naphthalene dicarboxylic acid, and benzophenone-4,4'-dicarboxylic acid; and
   (b2) at least one imidazole compound selected from the group consisting of 2-methylimidazole, 2-ethyl-4-methylimidazole, 2-undecylimidazole, and 2-phenyl-4-methyl-5-hydroxymethylimidazole;
   wherein said composition is configured for sealing a semiconductor.

2. A solid epoxy resin composition comprising the following components (A) to (C):
   (A) an epoxy resin;
   (B) a clathrate complex that shows an X-ray diffraction pattern, the clathrate complex comprising:
   (b1) at least one aromatic carboxylic acid compound selected from the group consisting of 2,6-naphthalene dicarboxylic acid, 1,4-naphthalene dicarboxylic acid, and benzophenone-4,4'-dicarboxylic acid; and
   (b2) at least one imidazole compound selected from the group consisting of 2-methylimidazole, 2-ethyl-4-methylimidazole, 2-undecylimidazole, and 2-phenyl-4-methyl-5-hydroxymethylimidazole; and
   (C) an inorganic filler;
   wherein said composition is configured for sealing a semiconductor.

3. A clathrate complex that shows an X-ray diffraction pattern, the clathrate complex comprising at least one aromatic carboxylic acid compound selected from the group consisting of 2,6-naphthalene dicarboxylic acid, 1,4-naphthalene dicarboxylic acid, and benzophenone-4,4'-dicarboxylic acid; and
   at least one imidazole compound selected from the group consisting of 2-methylimidazole, 2-ethyl-4-methylimidazole, 2-undecylimidazole, and 2-phenyl-4-methyl-5-hydroxymethylimidazole.

* * * * *